United States Patent
Wang et al.

(10) Patent No.: US 9,530,800 B2
(45) Date of Patent: Dec. 27, 2016

(54) ARRAY SUBSTRATE, DISPLAY PANEL AND METHOD FOR PREPARING ARRAY SUBSTRATE

(71) Applicant: Shenzhen China Star Optoelectronics Technology Co., Ltd., Shenzhen, Guangdong (CN)

(72) Inventors: Cong Wang, Guangdong (CN); Peng Du, Guangdong (CN); Lixuan Chen, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 70 days.

(21) Appl. No.: 14/435,468

(22) PCT Filed: Jan. 21, 2015

(86) PCT No.: PCT/CN2015/071168
§ 371 (c)(1),
(2) Date: Apr. 14, 2015

(87) PCT Pub. No.: WO2016/106892
PCT Pub. Date: Jul. 7, 2016

(65) Prior Publication Data
US 2016/0190171 A1    Jun. 30, 2016

(30) Foreign Application Priority Data

Dec. 30, 2014  (CN) .......................... 2014 1 0849415

(51) Int. Cl.
*H01L 27/14*    (2006.01)
*H01L 27/12*    (2006.01)
(Continued)

(52) U.S. Cl.
CPC ......... *H01L 27/1222* (2013.01); *H01L 27/124* (2013.01); *H01L 27/127* (2013.01);
(Continued)

(58) Field of Classification Search
CPC .................... H01L 29/78675; H01L 29/78633; H01L 29/66757
(Continued)

(56) References Cited

U.S. PATENT DOCUMENTS

2003/0027412 A1* 2/2003 Chen ................. H01L 29/66757
438/510
2004/0219723 A1* 11/2004 Peng ................... H01L 27/1214
438/166
(Continued)

*Primary Examiner* — Douglas Menz
(74) *Attorney, Agent, or Firm* — Andrew C. Cheng

(57) ABSTRACT

The invention provides an array substrate, a display panel and a method for preparing an array substrate. The array substrate includes multiple low temperature poly-silicon (LTPS) thin film transistors arranged in an array. Each LTPS thin film transistor includes: a substrate; a LTPS layer, a source, a drain and a first conductive layer disposed on a same surface of the substrate, the source and the drain respectively being arranged at two sides of the LTPS layer and electrically connected with the LTPS layer, the drain being electrically connected with the first conductive layer; an insulating layer disposed on the LTPS layer, the source, the drain and the first conductive layer; a gate disposed on the insulating layer and corresponding to the LTPS layer; a passivation layer disposed on the gate; and a second conductive layer disposed on the passivation layer and corresponding to the first conductive layer.

14 Claims, 7 Drawing Sheets

(51) Int. Cl.
*H01L 29/786* (2006.01)
*H01L 29/66* (2006.01)

(52) U.S. Cl.
CPC ...... *H01L 27/1248* (2013.01); *H01L 27/1262* (2013.01); *H01L 29/66757* (2013.01); *H01L 29/78633* (2013.01); *H01L 29/78675* (2013.01)

(58) Field of Classification Search
USPC .......................................................... 257/72
See application file for complete search history.

(56) References Cited

U.S. PATENT DOCUMENTS

| | | | |
|---|---|---|---|
| 2008/0171409 A1* | 7/2008 | Cheng | H01L 29/78696 438/160 |
| 2011/0140108 A1* | 6/2011 | Kimura | H01L 27/1225 257/57 |
| 2016/0043212 A1* | 2/2016 | Gao | H01L 27/1222 257/71 |
| 2016/0133473 A1* | 5/2016 | Wang | H01L 21/28114 257/72 |
| 2016/0133755 A1* | 5/2016 | Tian | H01L 29/78675 257/72 |

\* cited by examiner

ARRAY SUBSTRATE, DISPLAY PANEL AND METHOD FOR PREPARING ARRAY SUBSTRATE

CROSS REFERENCE TO RELATED APPLICATION

This application claims the priority of Chinese Patent Application No. 201410849415.6, entitled "Array Substrate, Display Panel and Method for Preparing Array Substrate", filed on Dec. 30, 2014, the disclosure of which is incorporated herein by reference in its entirety.

BACKGROUND OF THE INVENTION

1. Field of the Invention

The invention relates to the field of display technology, and particularly to an array substrate, a display panel and a method for preparing an array substrate.

2. Description of Related Art

A display apparatus such as liquid crystal display (LCD) is a commonly used electronic device, and because of its low power consumption, small size, light weight and other characteristics, it is quite popular for users. With the development of flat panel display technology, the demand for liquid crystal display with high resolution and low power consumption has been proposed. Since an electron mobility of amorphous silicon is low, and the low temperature poly-silicon can be produced at a low temperature and has an electron mobility higher than that of the amorphous silicon. In another aspect, a CMOS device fabricated by the low temperature poly-silicon can be applied for the liquid crystal display device high resolution and low power consumption, Therefore, the low temperature poly-silicon has been widely applied and studied. Currently, for an array substrate including a low temperature poly-silicon thin film transistor, due to the number/amount of masks for the low temperature poly-silicon is many, generally speaking, the number of masks of the low temperature poly-silicon thin film transistor array substrate is ten, resulting in the fabrication/preparation of low-temperature poly-silicon thin film transistor array substrate being more difficult and adverse to the productivity improvement.

SUMMARY OF THE INVENTION

The invention provides an array substrate. The array substrate includes a plurality of low temperature poly-silicon (LTPS) thin film transistors arranged in an array. Each of the plurality of low temperature poly-silicon thin film transistors includes: a substrate; a low temperature poly-silicon layer, a source, a drain and a first conductive layer disposed on a same surface of the substrate, wherein the low temperature poly-silicon layer is disposed at a middle portion of the surface of the substrate, the source and the drain respectively are disposed at two sides of the low temperature poly-silicon layer, an end of the source is electrically connected to an end of the low temperature poly-silicon layer, an end of the drain is electrically connected to another end of the low temperature poly-silicon layer, and another end of the drain is electrically connected to the first conductive layer; an insulating layer disposed on the low temperature poly-silicon layer, the source, the drain and the first conductive layer; a gate disposed on the insulating layer and corresponding to the low temperature poly-silicon layer; a passivation layer stacked on the gate; and a second conductive layer disposed on the passivation layer and corresponding to the first conductive layer, wherein the first conductive layer is used as a pixel electrode, and the second conductive layer is used as a common electrode.

In an embodiment, the array substrate further includes a light-shielding layer, the light-shielding layer is disposed on the surface of the substrate; the low temperature poly-silicon layer, the source, the drain and the first conductive layer are disposed on the surface through the light-shielding layer, and the light-shielding layer is disposed corresponding to the low temperature poly-silicon layer.

In an embodiment, the array substrate further includes a buffer layer, the buffer layer is staked on the light-shielding layer; the low temperature poly-silicon layer, the source, the drain and the first conductive layer are disposed on the surface of the substrate through the buffer layer and the light-shielding layer.

In an embodiment, the array substrate further includes a first ohmic contact layer, the first ohmic contact layer connects the source with the low temperature poly-silicon layer, the first ohmic contact layer is configured for reducing a contact resistance between the source and the low temperature poly-silicon layer.

In an embodiment, the array substrate further includes a second ohmic contact layer, the second ohmic contact layer connects the drain with the low temperature poly-silicon layer, the second ohmic contact layer is configured for reducing a contact resistance between the drain and the low temperature poly-silicon layer.

In another aspect, the invention provides a display panel. The display panel includes the array substrate according to any one of above described embodiments.

In still another aspect, the invention provides a method for preparing an array substrate, the method includes: providing a substrate; disposing a low temperature poly-silicon layer, a source, a drain and a first conductive layer on a surface of the substrate, the low temperature poly-silicon layer being disposed at a middle portion of the surface of the substrate, the source and the drain respectively being disposed at two sides of the low temperature poly-silicon layer, an end of the source being electrically connected to an end of the low temperature poly-silicon layer, an end of the drain being electrically connected to another end of the low temperature poly-silicon layer, and another end of the drain being electrically connected to the first conductive layer; forming an insulating layer, the insulating layer being formed on the low temperature poly-silicon layer, the source, the drain and the first conductive layer; forming a gate, the gate being disposed on the insulating layer; forming a passivation layer, the passivation layer being disposed on the gate; forming a second conductive layer, the second conductive layer being disposed on the passivation layer and corresponding to the first conductive layer, wherein the first conductive layer is configured as a pixel electrode, and the second conductive layer is configured as a common electrode.

In an embodiment, between the step of "providing a substrate" and the step of "disposing a low temperature poly-silicon layer, a source, a drain and a first conductive layer on a surface of the substrate, the low temperature poly-silicon layer being disposed at a middle portion of the surface of the substrate, the source and the drain respectively being disposed at two sides of the low temperature poly-silicon layer, an end of the source being electrically connected to an end of the low temperature poly-silicon layer, an end of the drain being electrically connected to another end of the low temperature poly-silicon layer, and another end of the drain being electrically connected to the first conductive layer", the method for preparing an array substrate further includes: forming a light-shielding layer on the surface of the substrate. The step of "disposing a low temperature poly-silicon layer, a source, a drain and a first conductive layer on a surface of the substrate, the low temperature poly-silicon layer being disposed at a middle portion of the surface of the substrate, the source and the drain respectively being disposed at two sides of the low temperature poly-silicon layer, an end of the source being electrically connected to an end of the low temperature poly-silicon layer, an end of the drain being electrically connected to another end of the low temperature poly-silicon layer, and another end of the drain being electrically connected to the first conductive layer" is that: disposing the low temperature poly-silicon layer, the source, the drain and the first conductive layer on the light-shielding layer.

In an embodiment, after the step of "forming a light-shielding layer on the surface of the substrate" and before the step of "disposing a low temperature poly-silicon layer, a source, a drain and a first conductive layer on a surface of the substrate, the low temperature poly-silicon layer being disposed at a middle portion of the surface of the substrate, the source and the drain respectively being disposed at two sides of the low temperature poly-silicon layer, an end of the source being electrically connected to an end of the low temperature poly-silicon layer, an end of the drain being electrically connected to another end of the low temperature poly-silicon layer, and another end of the drain being electrically connected to the first conductive layer", the method for preparing an array substrate further includes: forming a buffer layer on the light-shielding layer. The step of "disposing a low temperature poly-silicon layer, a source, a drain and a first conductive layer on a surface of the substrate, the low temperature poly-silicon layer being disposed at a middle portion of the surface of the substrate, the source and the drain respectively being disposed at two sides of the low temperature poly-silicon layer, an end of the source being electrically connected to an end of the low temperature poly-silicon layer, an end of the drain being electrically connected to another end of the low temperature poly-silicon layer, and another end of the drain being electrically connected to the first conductive layer" is that: disposing the low temperature poly-silicon layer, the source, the drain and the first conductive layer on the surface of the substrate through the buffer layer.

In an embodiment, the method for preparing an array substrate further includes: forming a first ohmic contact layer, wherein the first ohmic contact layer connects the source with the low temperature poly-silicon layer; forming a second ohmic contact layer, wherein the second ohmic contact layer connects the drain with the low temperature poly-silicon layer.

The array substrate and the method for preparing an array substrate according to the invention can be realized only need seven times of mask, the number/amount of masks used during forming the array substrate can be reduced, and therefore the invention is beneficial to Increase production capacity of the array substrate.

BRIEF DESCRIPTION OF THE DRAWINGS

In order to more clearly illustrate the technical solution of an embodiment of the invention, drawings will be used in the description of embodiments will be given a brief description below. Apparently, the drawings in the following description only are some of embodiments of the invention, the ordinary skill in the art can obtain other drawings according to these illustrated drawings without creative effort.

DETAILED DESCRIPTION OF THE PREFERRED EMBODIMENTS

In the following, with reference to accompanying drawings of embodiments of the invention, technical solutions in the embodiments of the invention will be clearly and completely described. Apparently, the embodiments of the invention described below only are a part of embodiments of the invention, but not all embodiments. Based on the described embodiments of the invention, all other embodiments obtained by ordinary skill in the art without creative effort belong to the scope of protection of the invention.

Figure 1:
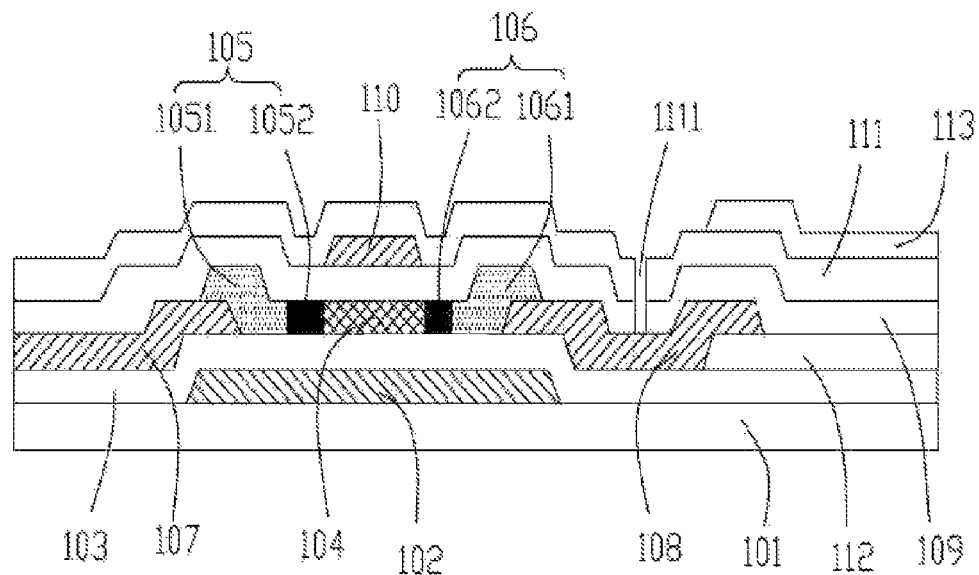
FIG. 1 is a schematic structural cross-sectional view of an array substrate according to a preferred embodiment of the invention.

Please refer to FIG. 1, FIG. 1 is a schematic structural cross-sectional view of an array substrate according to a preferred embodiment of the invention. The array substrate 10 includes a substrate 101, a low temperature poly-silicon layer 104, a source 107, a drain 108, a first conductive layer 112, an insulating layer 109, a gate 110, a passivation layer 111 and a second conductive layer 113. The low temperature poly-silicon layer 104, the source 107, the drain 108 and the first conductive layer 112 are disposed on a same surface of the substrate 101. The low temperature poly-silicon layer 104 is disposed at a middle portion of the surface of the substrate 101, the source 107 and the drain 108 respectively are disposed at two sides of the low temperature poly-silicon layer 104, an end of the source 107 is electrically connected to an end of the low temperature poly-silicon layer 104, an end of the drain 108 is electrically connected to another end of the low temperature poly-silicon layer 104, and another end of the drain 108 is electrically connected to the first conductive layer 112. The insulating layer 109 is disposed on the low temperature poly-silicon layer 104, the source 107, the drain 108 and the first conductive layer 112. The gate 110 is disposed on the insulating layer 109 and corresponding to the low temperature poly-silicon layer 104. The passivation layer 111 is disposed on the gate 110. The second conductive layer 113 is disposed on the passivation layer 111 and corresponding to the first conductive layer 112. The first conductive layer 112 is a pixel electrode, and the second conductive layer 113 is a common electrode. The low temperature poly-silicon layer 104, the source 107, the drain 108, the insulating layer 109 and the gate 110 constitute a low temperature poly-silicon thin film transistor.

The first substrate 101 includes a first surface a and a second surface b opposite to the first surface a. In this embodiment, the low temperature poly-silicon layer 104, the source 107, the drain 108 and the first conductive layer 112 are disposed on the first surface a of the substrate 101. In should be understood that, in other embodiment, the low temperature poly-silicon layer 104, the source 107, the drain 108 and the first conductive layer 112 are disposed on the second surface b of the substrate 101 instead. The substrate 101 is but not limited to a glass substrate.

The array substrate 10 further includes a light-shielding layer 102. The light-shielding layer 102 is disposed on a surface of the substrate 101. The low temperature poly-silicon layer 104, the source 107, the drain 108 and the first conductive layer 112 are disposed on the surface of the substrate 101 through the light-shielding layer 102, and the light-shielding layer 102 is disposed corresponding to the low temperature poly-silicon layer 104. In this embodiment, the light-shielding layer 102 is disposed on the first surface a of the substrate 101. The light-shielding layer 102 is used for preventing a pixel corresponding to the low temperature poly-silicon thin film transistor from leakage of light toward the second surface b.

The array substrate 10 further includes a buffer layer 103. The buffer layer 103 is stacked on the light-shielding layer 102. The low temperature poly-silicon layer 104, the source 107, the drain 108 and the first conductive layer 112 are disposed on the surface of the substrate 101 through the buffer layer 103 and the light-shielding layer 102. The buffer layer 103 is used for buffering the damage to the substrate 101 in the process for preparing/fabricating the array substrate 10.

The array substrate 10 further includes a first ohmic contact layer 105. The first ohmic contact layer 105 connects the source 107 with the low temperature poly-silicon layer 104. The first ohmic contact layer 105 is used for reducing a contact resistance between the source 107 and the low temperature poly-silicon layer 104. In this embodiment, the first ohmic contact layer 105 includes a first heavily-doped region 1051 and a first lightly-doped region 1052. An end of the first heavily-doped region 1051 is connected to the source 107, and another end of the first heavily-doped region 1052 is connected to an end of the first lightly-doped region 1052, and another end of the first lightly-doped region 1052 is connected to an end of the low temperature poly-silicon layer 104. One end of the first heavily-doped region 1051 and the source 107 are partially overlapped with each other, so as to increase a contact area of the first heavily-doped region 1051 with the source 107. The first heavily-doped region 1051 and the first lightly-doped region 1052 are doped with a same type of ion, such as both are doped with an N-type ion, but a doping concentration of the first heavily-doped region 1051 is larger than a doping concentration of the first lightly-doped region 1052. In this embodiment, the disposition of the first heavily-doped region 1051 and the first lightly-doped region 1052 not only can reduce the contact resistance between the source 107 and the low temperature poly-silicon layer 104 but also can reduce the leakage current of the low temperature poly-silicon thin film transistor.

The array substrate 10 further includes a second ohmic contact layer 106. The second ohmic contact layer 106 connects the drain 108 with the low temperature poly-silicon layer 104. The second ohmic contact layer 106 is used for reducing a contact resistance between the drain 108 and the low temperature poly-silicon layer 104. In this embodiment, the second ohmic contact layer 106 includes a second heavily-doped region 1061 and a second lightly-doped region 1062. An end of the second heavily-doped region 1061 is connected to the drain 108, another end of the second heavily-doped region 1061 is connected to an end of the second lightly-doped region 1062, and another end of the second lightly-doped region 1062 is connected to an end of the low temperature poly-silicon layer 104. One end of the second heavily-doped region 1061 and the drain 108 are partially overlapped with each other, so as to increase a contact area of the second heavily-dope region 1061 with the drain 108. The second heavily-doped region 1061 and the second lightly-doped region 1062 are doped with a same type of ion, such as both are doped with an N-type ion, but a doping concentration of the second heavily-doped region 1061 is larger than a doping concentration of the second lightly-doped region 1062. In this embodiment, the disposition of the second heavily-doped region 1061 and the second lightly-doped region 1062 not only can reduce the contact resistance between the drain 108 and the low temperature poly-silicon layer 104 but also can reduce the leakage current of the low temperature poly-silicon thin film transistor.

Figure 2:
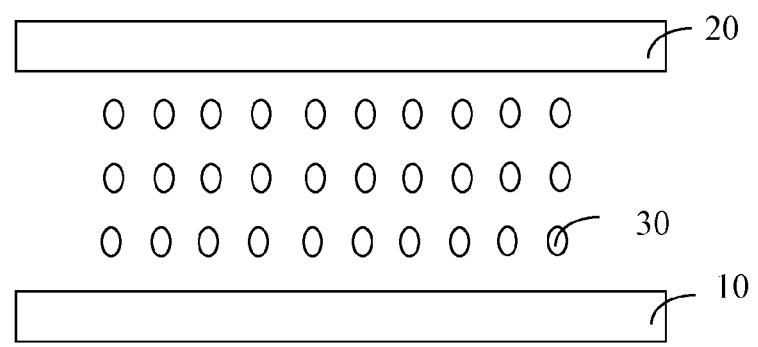
FIG. 2 is a schematic structural view of a display panel according to a preferred embodiment of the invention.

A display panel of the invention will be described below with reference to FIG. 1. Please refer to FIG. 2, FIG. 2 is a schematic structural view of a display panel according to a preferred embodiment of the invention. In particular, the display panel 1 includes the array substrate 10, a color filter substrate 20 and a liquid crystal layer 30. The array substrate 10 and the color filter substrate 20 are disposed opposite to each other, and the liquid crystal layer 30 is disposed between the array substrate 10 and the color filter substrate 20. The array substrate 10 includes the substrate 101, the low temperature poly-silicon layer 104, the source 107, the drain 108, the first conductive layer 112, the insulating layer 109, the gate 110, the passivation layer 111 and the second conductive layer 113. The low temperature poly-silicon layer 104, the source 107, the drain 108 and the first conductive layer 112 are disposed at a same surface of the substrate 101. The low temperature poly-silicon layer 104 is disposed at a middle portion of the surface of the substrate 101, the source 107 and the drain 108 respectively are disposed at two sides of the low temperature poly-silicon layer 104, an end of the source 107 is electrically connected to an end of the low temperature poly-silicon layer 104, an end of the drain 108 is electrically connected to another end of the low temperature poly-silicon layer 104, and another end of the drain 108 is electrically connected to the first conductive layer 112. The insulating layer 109 is disposed on the low temperature poly-silicon layer 104, the source 107, the drain 108 and the first conductive layer 112. The gate 110 is disposed on the insulating layer 109 and corresponding to the low temperature poly-silicon layer 104. The passivation layer 111 is disposed on the gate 110. The second conductive layer 113 is disposed on the passivation layer 111 and corresponding to the first conductive layer 112. The first conductive layer 112 is a pixel electrode, and the second conductive layer 113 is a common electrode. The low temperature poly-silicon layer 104, the source 107, the drain 108, the insulating layer 109 and the gate 110 constitute a low temperature poly-silicon thin film transistor.

The substrate 101 includes the first surface a and the second surface b opposite to the first surface a. In this embodiment, the low temperature poly-silicon layer 104, the source 107, the drain 108 and the first conductive layer 112 are disposed on the first surface a of the substrate 101. It should be understood that, in other embodiment, the low temperature poly-silicon layer 104, the source 107, the drain 108 and the first conductive layer 112 are disposed on the second surface b of the substrate 101 instead. The substrate 101 is but not limited to a glass substrate.

The array substrate 10 further includes a light-shielding layer 102. The light-shielding layer 102 is disposed on a surface of the substrate 101. The low temperature poly-silicon layer 104, the source 107, the drain 108 and the first conductive layer 112 are disposed on the surface of the substrate 101 through the light-shielding layer 102, and the light-shielding layer 102 is disposed corresponding to the low temperature poly-silicon layer 104. In this embodiment, the light-shielding layer 102 is disposed on the first surface a of the substrate 101. The light-shielding layer 102 is used for preventing the pixel corresponding to the low temperature poly-silicon thin film transistor from leakage of light toward the second surface b.

The array substrate 10 further includes a buffer layer 103. The buffer layer 103 is stacked on the light-shielding layer 102. The low temperature poly-silicon layer 104, the source 107, the drain 108 and the first conductive layer 112 are disposed on the surface of the substrate 101 through the buffer layer 103 and the light-shielding layer 102. The buffer layer 103 is used for buffering the damage to the substrate 101 in the process for preparing the array substrate 10.

The array substrate 10 further includes the first ohmic contact layer 105. The first ohmic contact layer 105 connects the source 107 with the low temperature poly-silicon layer 104. The first ohmic contact layer 105 is used for reducing a contact resistance between the source 107 and the low temperature poly-silicon layer 104. In this embodiment, the first ohmic contact layer 105 includes a first heavily-doped region 1051 and a first lightly-doped region 1052. An end of the first heavily-doped region 1051 is connected to the source 107, another end of the first heavily-doped region 1051 is connected to an end of the first lightly-doped region 1052, and another end of the first lightly-doped region 1052 is connected to an end of the low temperature poly-silicon layer 104. One end of the first heavily-doped region 1051 and the source 107 are partially overlapped with each other, so as to increase a contact area of the first heavily-doped region 1051 with the source 107. The first heavily-doped region 1051 and the firstly lightly-doped region 1052 are doped with a same type of ion, such as both are doped with an N-type ion, but a doping concentration of the first heavily-doped region 1051 is larger than a doping concentration of the first lightly-doped region 1052. In this embodiment, the disposition of the first heavily-doped region 1051 and the first lightly-doped region 1052 not only can reduce the contact resistance between the source 107 and the low temperature poly-silicon layer 104 but also can reduce the leakage current of the low temperature poly-silicon thin film transistor.

The array substrate 10 further includes the second ohmic contact layer 106. The second ohmic contact layer 106 connects the drain 108 and the low temperature poly-silicon layer 104. The second ohmic contact layer 106 is used for reducing a contact resistance between the drain 108 and the low temperature poly-silicon layer 104. In this embodiment, the second ohmic contact layer 106 includes a second heavily-doped region 1061 and a second lightly-doped region 1062. An end of the second heavily-doped region 1061 is connected to the drain 108, another end of the second heavily-doped region 1061 is connected to an end of the second lightly-doped region 1062, and another end of the second lightly-doped region 1062 is connected to the low temperature poly-silicon layer 104. One end of the second heavily-doped region 1061 and the drain 108 are partially overlapped with each other, so as to increase a contact area of the second heavily-doped region 1061 with the drain 108. The second heavily-doped region 1061 and the second lightly-doped region 1062 are doped with a same type of ion, such as both are doped with an N-type ion, but a doping concentration of the second heavily-doped region 1061 is larger than a doping concentration of the second lightly-doped region 1062. In this embodiment, the disposition of the second heavily-doped region 1061 and the second lightly-doped region 1062 not only can reduce the contact resistance between the drain 108 and the low temperature poly-silicon layer 104 but also can reduce the leakage current of the low temperature poly-silicon thin film transistor.

Figure 3:
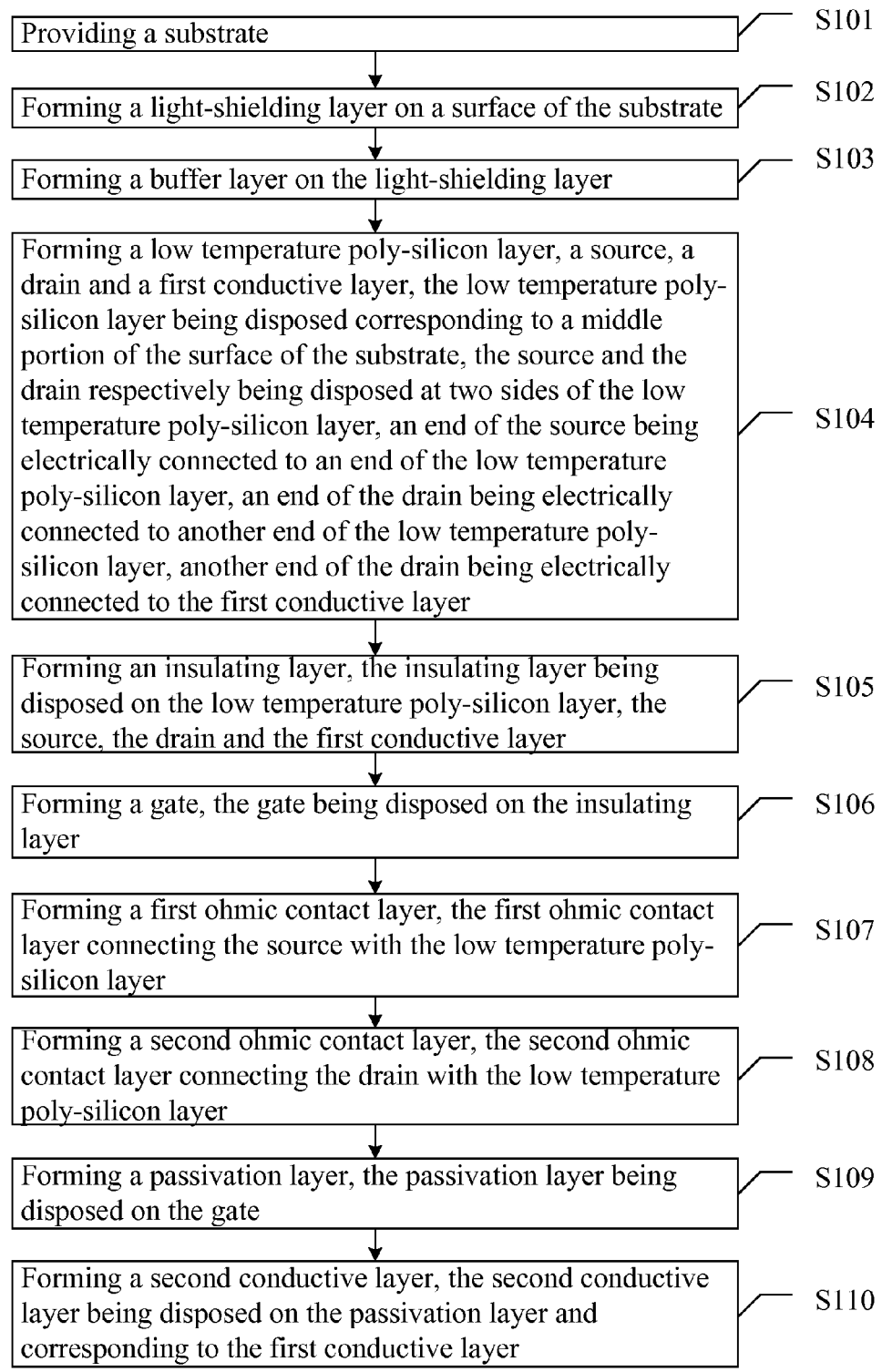
FIG. 3 is a flowchart of a method for preparing an array substrate according to a preferred embodiment of the invention.

A method for preparing an array substrate according to the invention will be described below with reference to FIG. 1. Please refer to FIG. 3, a method for preparing an array substrate includes but is not limited to the following steps.

Figure 4:
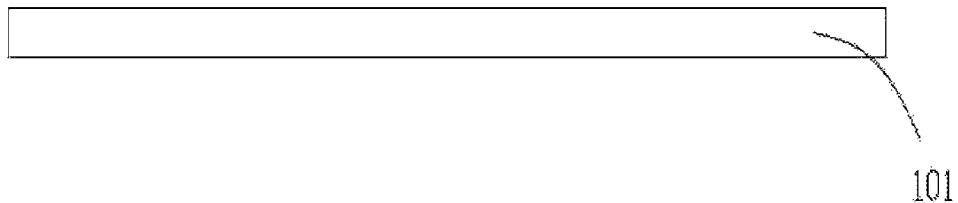
FIG. 4 through FIG. 15 are schematic cross-sectional views corresponding to various process steps of the method for preparing an array substrate according to the invention.
Figure 5:
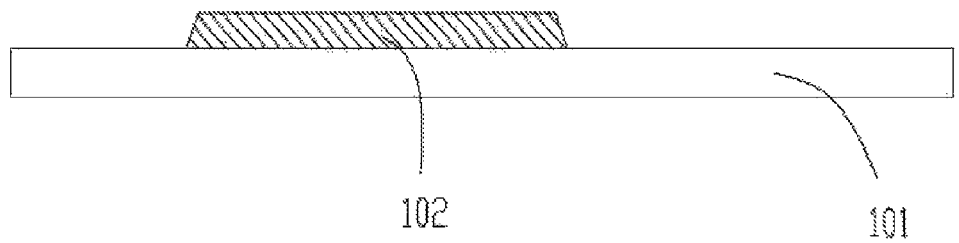

Step S101: providing a substrate 101. Please refer to FIG. 4, the substrate 101 includes a first surface a and a second surface b opposite to the first surface a. In this embodiment, the low temperature poly-silicon layer 104, the source 107, the drain 108 and the first conductive layer 112 are disposed on the first surface a of the substrate 101. It should be understood that, in other embodiment, the low temperature poly-silicon layer 104, the source 107, the drain 108 and the first conductive layer 112 are disposed on the second surface b of the substrate 101 instead The substrate 101 is but not limited to a glass substrate.

Step S102: forming a light-shielding layer 102 on a surface of the substrate 101. Please refer to FIG, 5, in this embodiment, the light-shielding layer 102 is formed at a middle portion of the first surface a of the substrate 101. In other embodiment, the light-shielding layer 102 is formed at a middle portion of the second surface b of the substrate 101 instead. The light-shielding layer 102 can be formed by the following method that: firstly, a light-shielding layer is entirely formed on the first surface a of the substrate 101, the entirely formed light-shielding layer then is performed with exposure and development and etched to form a designated pattern as the light-shielding layer 102. In this embodiment, one time of mask is used, and for the convenience of description, the used mask in this step is called as first mask. Moreover, in this embodiment, the light-shielding layer 102 is disposed on the first surface a of the substrate 101. The light-shielding layer 102 is used for preventing the pixel corresponding to the low temperature poly-silicon thin film transistor from leakage of light toward the second surface b.

Figure 6:
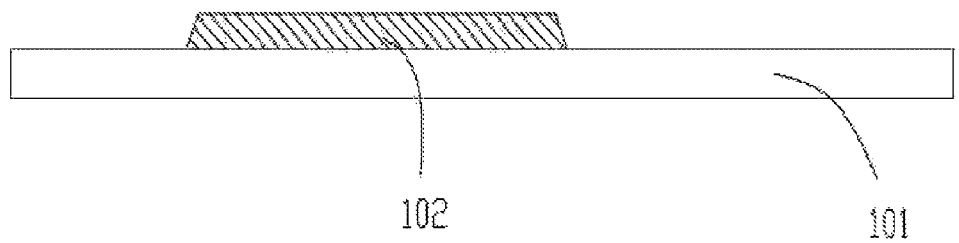

Step S103: forming a buffer layer 103 on the light-shielding layer 102. Please refer to FIG. 6, a buffer layer 103 is entirely formed overlying the light-shielding layer 102 and the surface of the substrate 101 uncovered by the light-shielding layer 102. The buffer layer 103 is used for buffering the damage to the substrate 101 during the process for preparing the array substrate 10.

Step S104: forming a low temperature poly-silicon layer 104, a source 107, a drain 108 and a first conductive layer 112, the low temperature poly-silicon layer 104 being disposed corresponding to a middle portion of the surface of the substrate 101, the source 107 and the drain 108 being disposed at two sides of the low temperature poly-silicon layer 104 respectively, an end of the source 107 being electrically connected to an end of the low temperature poly-silicon layer 104, an end of the drain 108 being connected to another end of the low temperature poly-silicon layer 104, and another end of the drain 108 being electrically connected to the first conductive layer 112.

Figure 7:
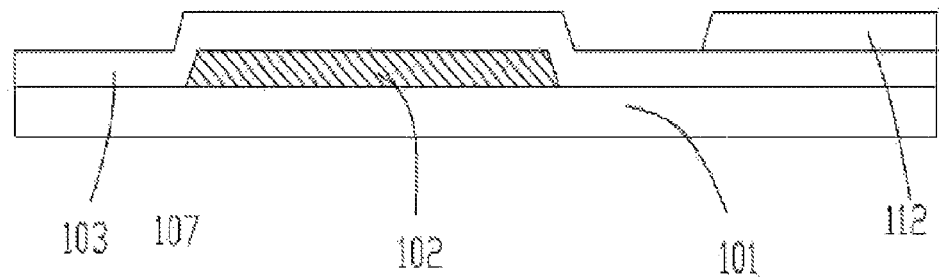

Please refer to FIG. 7, firstly, the first conductive layer 112 is formed on the buffer layer 103, and the first conductive layer 112 is disposed overlying a portion of the buffer layer 103 which does not cover the light-shielding layer 102. The buffer layer 103 can be formed by the following method that: a conductive layer firstly is entirely formed on the buffer layer 103, the entirely formed conductive layer then is performed with exposure and development and etched to form a designated pattern as the first conductive layer 112. The first conductive layer 112 is used as a pixel electrode. During the process of forming the first conductive layer 112, one time of mask is used, and for the convenience of description, the mask used in the process of forming the first conductive layer 112 is called as second mask.

Figure 8:
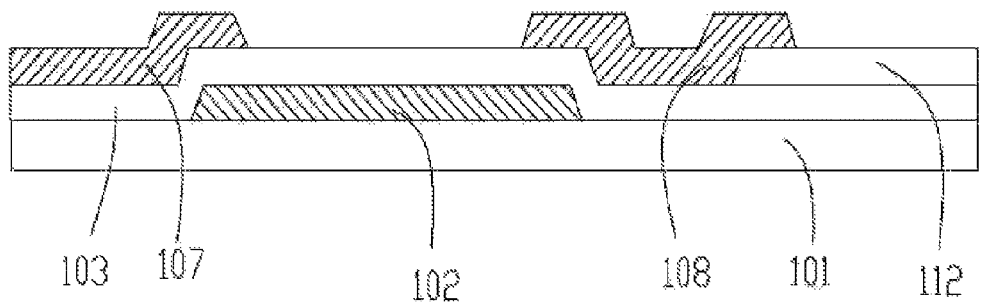

Please refer to FIG. 8, the source 107 and the drain 108 are formed on the buffer layer 103. The source 107 and the drain 108 are disposed corresponding to two ends of the light-shielding layer 102 respectively. The formation of the source 107 and the drain 108 can be achieved by the following method that: a metal layer firstly is entirely formed on the buffer layer 103, the entirely formed metal layer then is performed with exposure and development and etched to form a designated pattern so as to form the source 107 and the drain 108. During the process of forming the source 107 and the drain 108, one time of mask is used, and for the convenience of description, the mask used in the process of forming the source 107 and the drain 108 is called as third mask.

Figure 9:
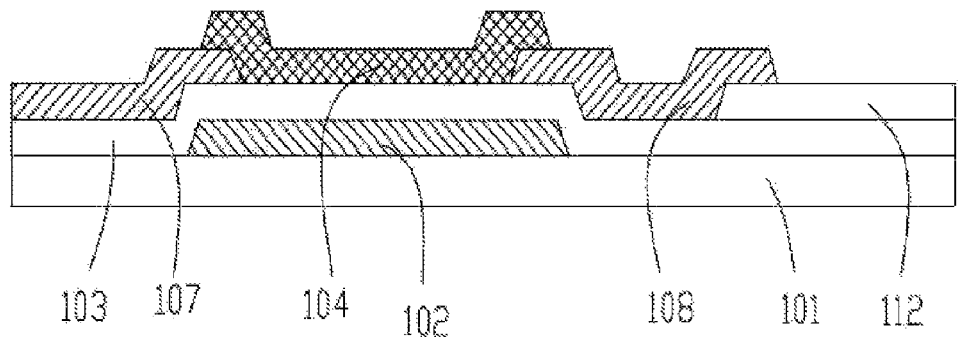

Please refer to FIG. 9, forming a low temperature poly-silicon layer 104 on the buffer layer 103, the low temperature poly-silicon layer 104 being disposed between the source 107 and the drain 108, and two ends of the low temperature poly-silicon layer 104 respectively being connected with the source 107 and the drain 108. The formation of the low temperature poly-silicon layer 104 can be achieved by the following method that: an entire layer of low temperature poly-silicon firstly is formed on the buffer layer 103, the entire layer of low temperature poly-silicon then is performed with exposure and development and etched to form a designated pattern so as to form the low temperature poly-silicon layer 104. During the process of forming the low temperature poly-silicon layer 104, one time of mask is used, and for the convenience of description, the mask used in the process of forming the low temperature poly-silicon layer 104 is called as fourth mask.

Figure 10:
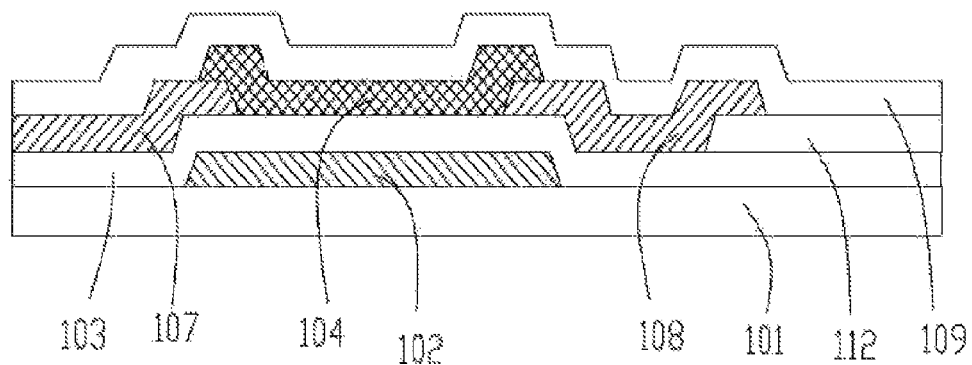

Step S105: forming an insulating layer 109, the insulating layer being disposed on the low temperature poly-silicon layer 104, the source 107, the drain 18 and the first conductive layer 112, please refer to FIG. 10.

Figure 11:
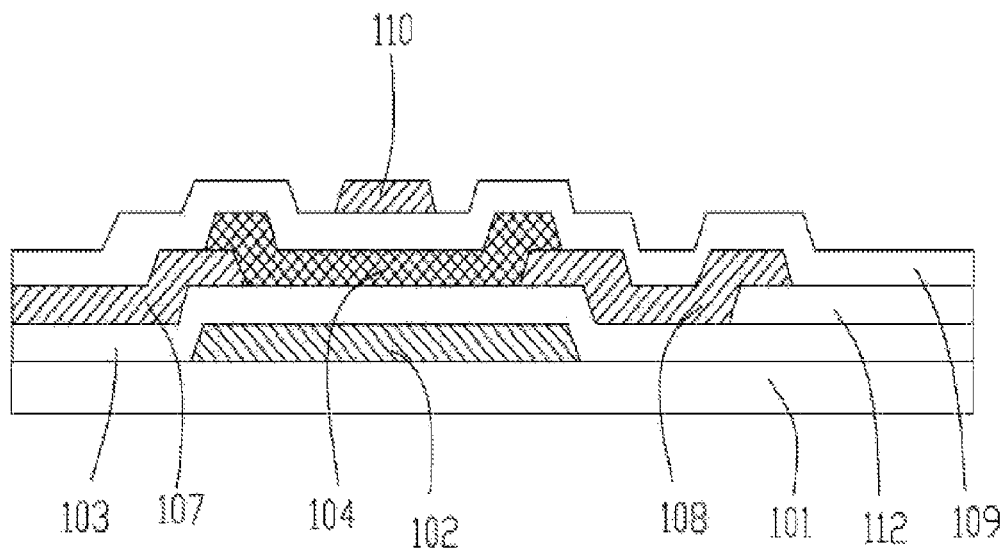

Step S106: forming a gate 110, the gate 110 being disposed on the insulating layer 109. Please refer to FIG. 11, the gate 110 can be formed by the following method that: a metal layer is entirely formed on the insulating layer 109, the entirely formed metal layer then is performed with exposure and development and etched to form a designated pattern so as to form the gate 110. During the process of forming the gate 110, one time of mask is used, and for the convenience of description, the mask used in the process of forming the gate 110 is called as fifth mask.

Figure 12:
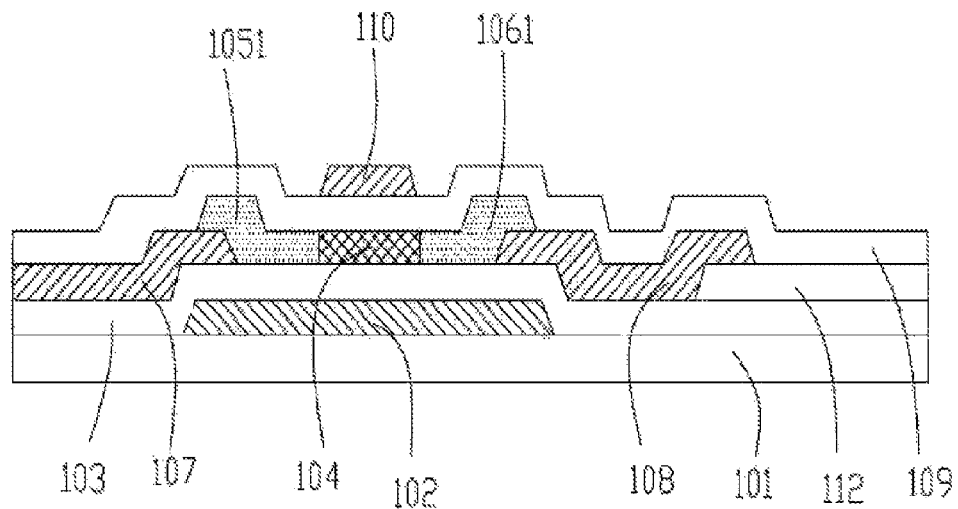

Step S107: forming a first ohmic contact layer 105, the ohmic contact layer 105 connecting the source 107 with the low temperature poly-silicon layer 104. Please refer to FIG. 12, the formation of the first ohmic contact layer 105 refers to the foregoing description and thus will not be repeated herein.

Figure 13:
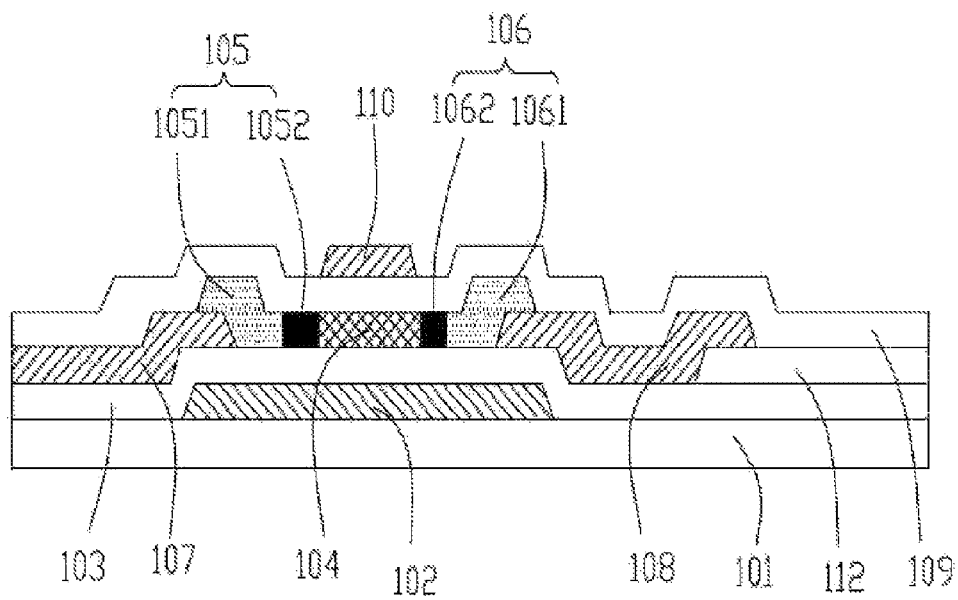

Step S108: forming a second ohmic contact layer 106, the second ohmic contact layer 106 connecting the drain 108 with the low temperature poly-silicon layer 104. Please refer to FIG. 13, the formation of the second ohmic contact layer 106 refers to the foregoing description and thus will not be repeated herein.

Figure 14:
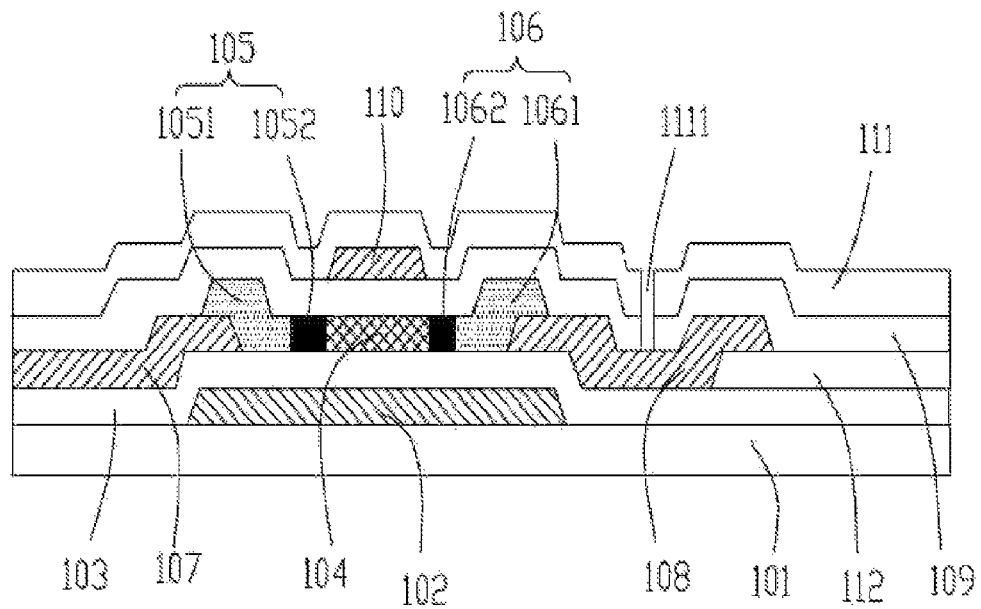

Step S109: forming a passivation layer 111, the passivation layer 111 being disposed on the gate 110. Please refer to FIG. 14, a through hole 1111 is formed in the passivation layer 111, and the formation of the through hole 1111 also needs one time of mask, and the mask herein is called sixth mask.

Figure 15:
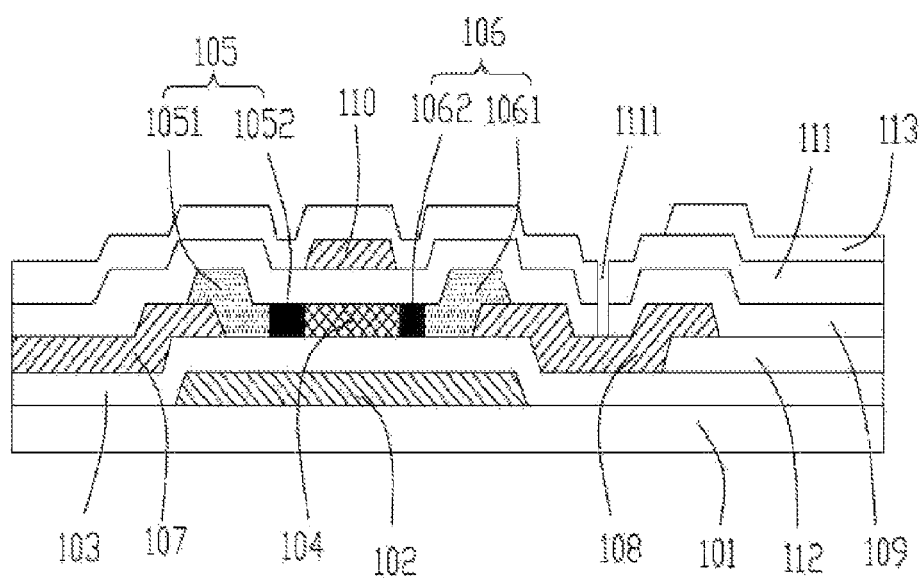

Step S110: forming a second conductive layer 113, the second conductive layer 113 being disposed on the passivation layer 111 and corresponding to the first conductive layer 112. The first conductive layer 112 is used as a pixel electrode, and the second conductive layer 113 is used as a common electrode. Please refer to FIG. 15, the formation of the second conductive layer 113 can be achieved by the following method that: a conductive layer firstly is entirely formed on the passivation layer 111, the entirely formed conductive layer then is performed with exposure and development and etched to form a designated pattern so as to form the second conductive layer 113. The formation of the second conductive layer 113 needs one time of mask, and for the convenience of description, the mask herein is called as seventh mask.

According to the description of the method for preparing an array substrate of the invention, it can be found that the array substrate and the method for preparing an array substrate according to the invention can be realized need only seven times of mask, the number/amount of masks used during forming the array substrate can be reduced, and therefore the invention is beneficial to Increase production capacity of the array substrate.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. An array substrate comprising a plurality of low temperature poly-silicon thin film transistors arranged in an array, each of the plurality of low temperature poly-silicon thin film transistors comprising:
    a substrate;
    a low temperature poly-silicon layer, a source, a drain and a first conductive layer disposed on a same surface of the substrate, wherein the low temperature poly-silicon layer is disposed at a middle portion of the surface of the substrate, the source and the drain respectively are disposed at two sides of the low temperature poly-silicon layer, an end of the source is electrically connected to an end of the low temperature poly-silicon layer, an end of the drain is electrically connected to another end of the low temperature poly-silicon layer, and another end of the drain is electrically connected to the first conductive layer;
    an insulating layer disposed on the low temperature poly-silicon layer, the source, the drain and the first conductive layer;
    a gate disposed on the insulating layer and corresponding to the low temperature poly-silicon layer;
    a passivation layer stacked on the gate; and
    a second conductive layer disposed on the passivation layer and corresponding to the first conductive layer, wherein the first conductive layer is used as a pixel electrode, and the second conductive layer is used as a common electrode.

2. The array substrate as claimed in claim 1, wherein the array substrate further comprises a light-shielding layer, the light-shielding layer is disposed on the surface of the substrate; the low temperature poly-silicon layer, the source, the drain and the first conductive layer are disposed on the surface through the light-shielding layer, and the light-shielding layer is disposed corresponding to the low temperature poly-silicon layer.

3. The array substrate as claimed in claim 2, wherein the array substrate further comprises a buffer layer, the buffer layer is staked on the light-shielding layer; the low temperature poly-silicon layer, the source, the drain and the first conductive layer are disposed on the surface of the substrate through the buffer layer and the light-shielding layer.

4. The array substrate as claimed in claim 1, wherein the array substrate further comprises a first ohmic contact layer, the first ohmic contact layer connects the source with the low temperature poly-silicon layer, the first ohmic contact layer is configured for reducing a contact resistance between the source and the low temperature poly-silicon layer.

5. The array substrate as claimed in claim 4, wherein the array substrate further comprises a second ohmic contact layer, the second ohmic contact layer connects the drain with the low temperature poly-silicon layer, the second ohmic contact layer is configured for reducing a contact resistance between the drain and the low temperature poly-silicon layer.

6. A display panel comprising an array substrate, the array substrate comprising a plurality of low temperature poly-silicon thin film transistors arranged in an array, each of the plurality of low temperature poly-silicon thin film transistors comprising:
   a substrate;
   a low temperature poly-silicon layer, a source, a drain and a first conductive layer disposed on a same surface of the substrate, wherein the low temperature poly-silicon layer is disposed at a middle portion of the surface of the substrate, the source and the drain respectively are disposed at two sides of the low temperature poly-silicon layer, an end of the source is electrically connected to an end of the low temperature poly-silicon layer, an end of the drain is electrically connected to another end of the low temperature poly-silicon layer, and another end of the drain is electrically connected to the first conductive layer;
   an insulating layer disposed on the low temperature poly-silicon layer, the source, the drain and the first conductive layer;
   a gate disposed on the insulating layer and corresponding to the low temperature poly-silicon layer;
   a passivation layer stacked on the gate; and
   a second conductive layer disposed on the passivation layer and corresponding to the first conductive layer, wherein the first conductive layer is used as a pixel electrode, and the second conductive layer is used as a common electrode.

7. The display panel as claimed in claim 6, wherein the array substrate further comprises a light-shielding layer, the light-shielding layer is disposed on the surface of the substrate; the low temperature poly-silicon layer, the source, the drain and the first conductive layer are disposed on the surface through the light-shielding layer, and the light-shielding layer is disposed corresponding to the low temperature poly-silicon layer.

8. The display panel as claimed in claim 7, wherein the array substrate further comprises a buffer layer, the buffer layer is staked on the light-shielding layer; the low temperature poly-silicon layer, the source, the drain and the first conductive layer are disposed on the surface of the substrate through the buffer layer and the light-shielding layer.

9. The display panel as claimed in claim 6, wherein the array substrate further comprises a first ohmic contact layer, the first ohmic contact layer connects the source with the low temperature poly-silicon layer, the first ohmic contact layer is configured for reducing a contact resistance between the source and the low temperature poly-silicon layer.

10. The display panel as claimed in claim 9, wherein the array substrate further comprises a second ohmic contact layer, the second ohmic contact layer connects the drain with the low temperature poly-silicon layer, the second ohmic contact layer is configured for reducing a contact resistance between the drain and the low temperature poly-silicon layer.

11. A method for preparing an array substrate, the method comprising:
   providing a substrate;
   disposing a low temperature poly-silicon layer, a source, a drain and a first conductive layer on a surface of the substrate, the low temperature poly-silicon layer being disposed at a middle portion of the surface of the substrate, the source and the drain respectively being disposed at two sides of the low temperature poly-silicon layer, an end of the source being electrically connected to an end of the low temperature poly-silicon layer, an end of the drain being electrically connected to another end of the low temperature poly-silicon layer, and another end of the drain being electrically connected to the first conductive layer;
   forming an insulating layer, the insulating layer being formed on the low temperature poly-silicon layer, the source, the drain and the first conductive layer;
   forming a gate, the gate being disposed on the insulating layer;
   forming a passivation layer, the passivation layer being disposed on the gate;
   forming a second conductive layer, the second conductive layer being disposed on the passivation layer and corresponding to the first conductive layer, wherein the first conductive layer is configured as a pixel electrode, and the second conductive layer is configured as a common electrode.

12. The method for preparing an array substrate as claimed in claim 11, wherein between the step that providing a substrate and the step that disposing a low temperature poly-silicon layer, a source, a drain and a first conductive layer on a surface of the substrate, the low temperature poly-silicon layer being disposed at a middle portion of the surface of the substrate, the source and the drain respectively being disposed at two sides of the low temperature poly-silicon layer, an end of the source being electrically connected to an end of the low temperature poly-silicon layer, an end of the drain being electrically connected to another end of the low temperature poly-silicon layer, and another end of the drain being electrically connected to the first conductive layer, the method for preparing an array substrate further comprises:
   forming a light-shielding layer on the surface of the substrate;
   the step that disposing a low temperature poly-silicon layer, a source, a drain and a first conductive layer on a surface of the substrate, the low temperature poly-silicon layer being disposed at a middle portion of the surface of the substrate, the source and the drain respectively being disposed at two sides of the low temperature poly-silicon layer, an end of the source being electrically connected to an end of the low temperature poly-silicon layer, an end of the drain being electrically connected to another end of the low temperature poly-silicon layer, and another end of the drain being electrically connected to the first conductive layer is that:

disposing the low temperature poly-silicon layer, the source, the drain and the first conductive layer on the light-shielding layer.

13. The method for preparing an array substrate as claimed in claim 12, wherein after the step that forming a light-shielding layer on the surface of the substrate and before the step that disposing a low temperature poly-silicon layer, a source, a drain and a first conductive layer on a surface of the substrate, the low temperature poly-silicon layer being disposed at a middle portion of the surface of the substrate, the source and the drain respectively being disposed at two sides of the low temperature poly-silicon layer, an end of the source being electrically connected to an end of the low temperature poly-silicon layer, an end of the drain being electrically connected to another end of the low temperature poly-silicon layer, and another end of the drain being electrically connected to the first conductive layer, the method for preparing an array substrate further comprises:

forming a buffer layer on the light-shielding layer;

the step that disposing a low temperature poly-silicon layer, a source, a drain and a first conductive layer on a surface of the substrate, the low temperature poly-silicon layer being disposed at a middle portion of the surface of the substrate, the source and the drain respectively being disposed at two sides of the low temperature poly-silicon layer, an end of the source being electrically connected to an end of the low temperature poly-silicon layer, an end of the drain being electrically connected to another end of the low temperature poly-silicon layer, and another end of the drain being electrically connected to the first conductive layer is that:

disposing the low temperature poly-silicon layer, the source, the drain and the first conductive layer on the surface of the substrate through the buffer layer.

14. The method for preparing an array substrate as claimed in claim 11, wherein the method for preparing an array substrate further comprises:

forming a first ohmic contact layer, wherein the first ohmic contact layer connects the source with the low temperature poly-silicon layer;

forming a second ohmic contact layer, wherein the second ohmic contact layer connects the drain with the low temperature poly-silicon layer.

* * * * *